United States Patent [19]

Kekas et al.

[11] Patent Number: 4,527,285

[45] Date of Patent: Jul. 2, 1985

[54] PLUGGABLE TERMINAL ARCHITECTURE

[75] Inventors: Dennis H. Kekas; George R. Stilwell, Jr., both of Raleigh; Robert M. Walsh, Cary; Roger C. Williams, Raleigh, all of N.C.

[73] Assignee: International Business Machines Corporation, Armonk, N.Y.

[21] Appl. No.: 362,681

[22] Filed: Mar. 29, 1982

[51] Int. Cl.³ .............................................. H04B 9/00
[52] U.S. Cl. .................................... 455/607; 361/393; 361/394; 361/429; 455/602
[58] Field of Search ............... 455/349, 600, 606, 607, 455/617, 602; 361/380, 391, 392, 393, 394, 395, 400, 407, 417, 419, 420, 427, 429

[56] References Cited

U.S. PATENT DOCUMENTS

| | | | |
|---|---|---|---|
| 4,063,083 | 12/1977 | Cathey et al. | 455/607 |
| 4,241,381 | 12/1980 | Cobaugh et al. | 361/415 |
| 4,358,858 | 11/1982 | Tamura et al. | 455/607 |
| 4,367,513 | 1/1983 | Cronin | 361/419 |
| 4,384,368 | 5/1983 | Rosenfeldt et al. | 455/602 |
| 4,393,515 | 7/1983 | de Neumann | 455/606 |
| 4,403,271 | 9/1983 | Flanigan et al. | 361/393 |
| 4,420,793 | 12/1983 | Strandberg | 361/415 |

FOREIGN PATENT DOCUMENTS

| | | | |
|---|---|---|---|
| 2264205 | 7/1974 | Fed. Rep. of Germany | 361/429 |
| 2453535 | 5/1976 | Fed. Rep. of Germany | 361/394 |
| 1240608 | 8/1960 | France | 361/394 |

OTHER PUBLICATIONS

Ephraim et al.—Transceiver Module Assembly—IBM Tech. Discl. Bulletin, vol. 22, No. 5, Oct. 1979, pp. 2077-2078.

Dibble et al.—Base Pluggable Design—IBM Tech. Discl. Bulletin, vol. 24, No. 1A, Jun. 1981, p. 28.

Primary Examiner—Joseph A. Orsino, Jr.
Attorney, Agent, or Firm—Joscelyn G. Cockburn

[57] ABSTRACT

A modular terminal comprising a frame, a data distribution chamber, a power distribution apparatus and plural functional units. The functional units are supported and oriented by the frame in such a way that each interconnects with the power distribution components. Functional units communicate via optical transmissions through the data distribution chamber. This allows a functional unit to be inserted, removed or moved from one frame location to another without special equipment or tools by unskilled personnel.

12 Claims, 19 Drawing Figures

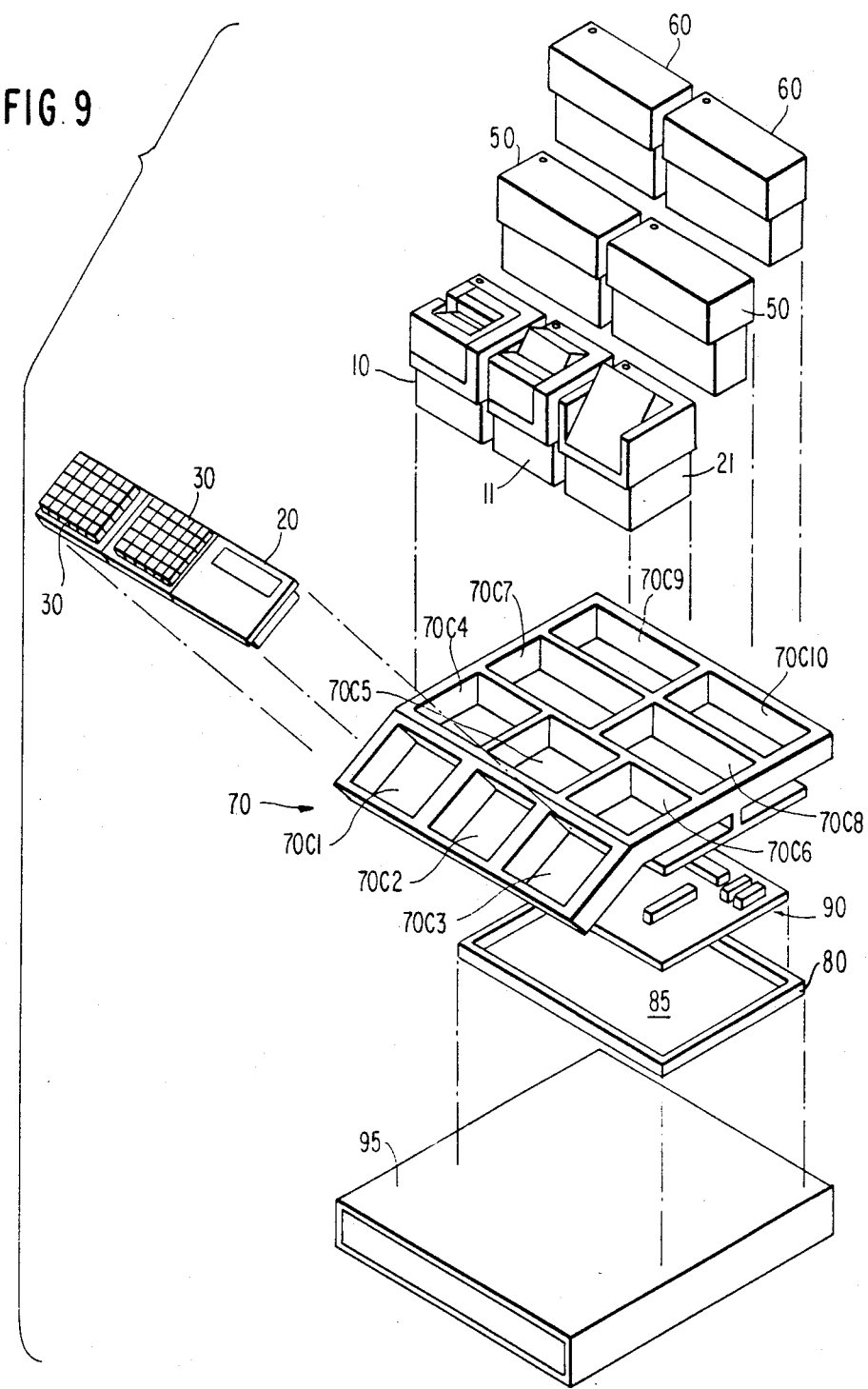

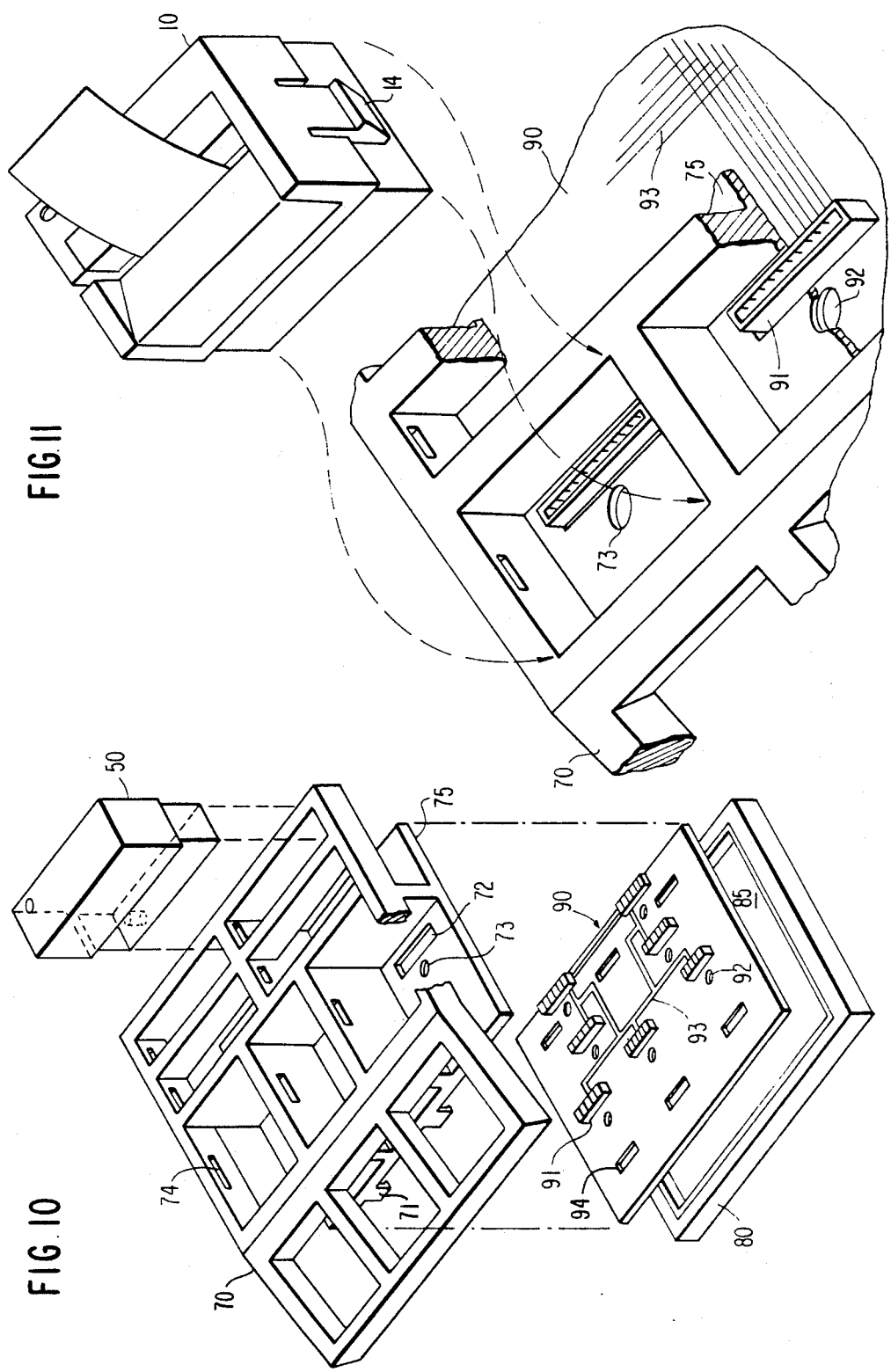

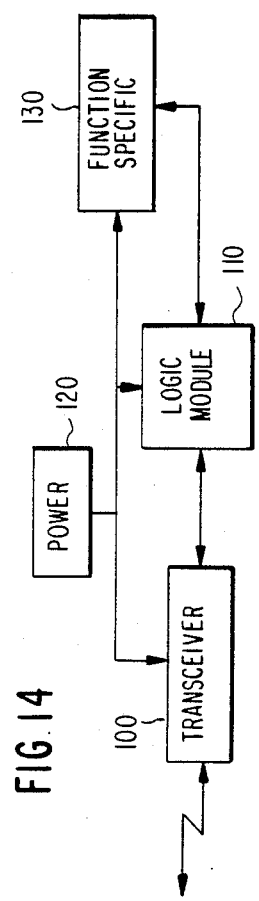
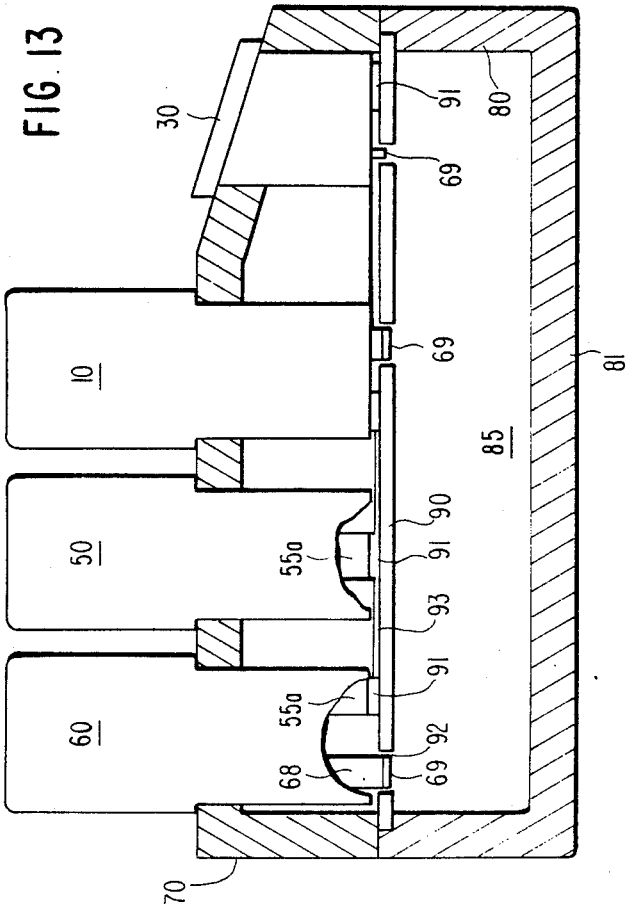
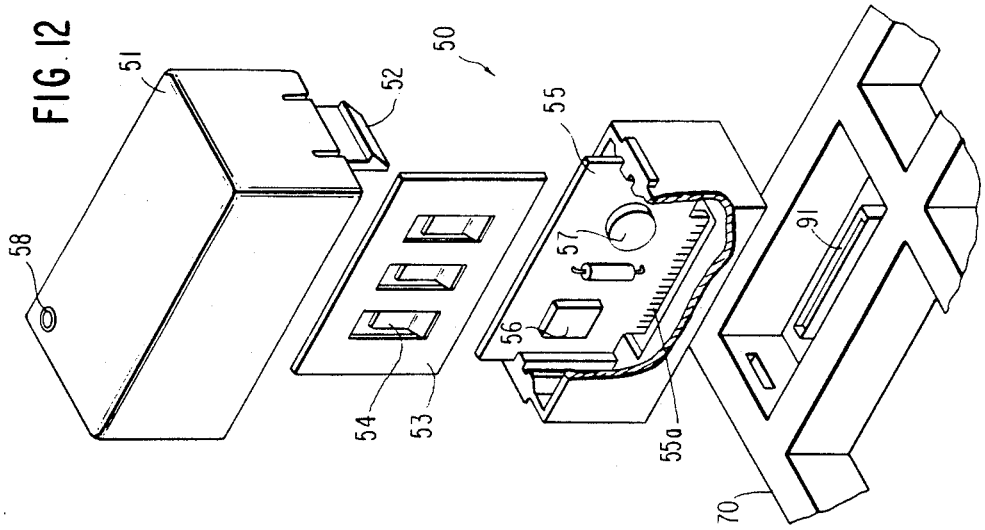

PLUGGABLE TERMINAL ARCHITECTURE

TECHNICAL FIELD

The present invention relates to a novel terminal including one or more functional units located in a supporting frame arranged so that the functional units can be relocated by unskilled personnel.

RELATED APPLICATION

The Stilwell co-pending application entitled *Optical Cavity Communication*, Ser. No. 362,691, filed on even date herewith and assigned to the assignee of this application, describes the functional unit communication employed in an embodiment of the invention and is incorporated herein by this reference.

BACKGROUND ART

For purposes of the present application, a terminal, as used herein, refers to a machine which is designed to interface with a human operator for the communication of information between the machine and operator. The terminal includes equipment which is capable of receiving information from the human operator, providing or transmitting information to the human operator and in many cases processing information received by the human operator either at that time or at some prior time to provide information for transmission to the human operator. A typical example of a prior art terminal is a point of sale terminal used in retail applications, supermarkets, banks and the like. The various equipments included in a prior art terminal can be segregated on the basis of function. For example, terminals designed to receive information from a human operator may have one or more switches which can be manipulated by the operator for providing information to the terminal. In many cases the switches take the form of a keyboard, i.e. a numerical key pad, a full qwerty keyboard, a keyboard uniquely related to the particular terminal application (such as for example those found in fast-food restaurants and the like) and combinations or sub-combinations of the foregoing. Other types of inputs that can be accomplished via a terminal call for different equipment such as, for example, a magnetic stripe reader, a wand or other device for optical bar code reading, etc. Output functions can be implemented with cathode ray tubes, LED arrays, gas panel arrays or hard copy printers using a variety of conventional technologies.

The terminal also includes, or has available to it, additional equipment which provides it with some degree of "intelligence" to interpret its input and determine its output. Originally, many terminals shared common equipment for the purpose of providing "intelligence". More recently, it has become more and more typical to provide the "intelligence" in the form of terminal-based equipment. Even more recently, the "intelligence" in a terminal has been, at least partially, distributed throughout the terminal. As a result, each of the different input or output units (of the terminal) has associated with it its own intelligence at least for the purpose of responding to inputs and/or formatting outputs. In most cases, however, even where some of the "intelligence" is distributed, there is still a central controller with which the other input or output units communicate. As a result of this distribution of "intelligence", the various functional units become more and more self-contained. This has allowed the needs of a particular customer to be satisfied by manufacturing a series of compatible functional units which can be selected and assembled into a customized terminal for a particular application. This allows, for example, a keyboard to be located on the left, right or middle of a terminal, a particular type of display and/or printer to be selected and located according to the particular customer's needs. While the foregoing technique has reduced the number of different functional units that must be manufactured, prior to final assembly, we believe further improvement in a number of areas is possible.

Those of ordinary skill in the art will understand that the various units must be interconnected so as to allow for communication therebetween. For example, the central controller must be capable of responding to the various inputs, initially present at an input functional unit, and thus a communication path is required between the input units and the controller. In addition, for output purposes some communication path is necessary to communicate information to be output, to one of the output functional units. Present practice provides these communication path via a plurality of groups of conductors. For example, the communication path between a particular input unit and the central controller might be provided by a first wiring harness, a communication path between the central controller and an output unit would be provided by a different wiring harness. However, because the "run" from, for example a keyboard in one location to a central controller is different from the "run" from that keyboard in a different location to the central controller, different wiring harnesses must be manufactured and stocked to enable a terminal to be configured with the keyboard in either location.

Even though different terminals are made up out of a library of common functional units, stocking requirements are multiplied since the terminals for sale must be manufactured and stocked in a variety of configurations. For example, if a terminal with a customized keyboard is desired, then such customized terminal keyboards are desirably stocked; in addition to standard terminal keyboards, etc. It should be readily apparent that the different varieties of terminals require a large stock to satisfy different customer needs.

In addition, a customer, who for example had specified a terminal with a standard keyboard, may on receipt of the same discover that his needs require a customized terminal keyboard. This requires return of the terminal with the standard keyboard and shipping of the terminal with the customized keyboard.

We believe that maintenance problems can also be significantly reduced. With present practice, when a functional unit in a terminal fails, either service personnel must travel to the customer's location to repair the unit or the entire terminal (with its full complement of otherwise perfectly functioning units) must be returned for repair. Maintenance and service is also complicated by the extensive cabling which is susceptible to electromagnetic interference as well as multiplying the failure probabilities.

It is not at all unusual for customer requirements to change over time. In the past, if the customer had received a terminal of relatively limited capability, and his needs grew to the point where he required a terminal of more capability, his needs could only be met by purchasing a different piece of equipment.

Finally, the final assembly step, as presently practiced, results in tying up inordinate amounts of stock, by multiplying the stock requirements for the various functional units in order to provide terminals of varying configurations. This final assembly step is in addition, labor-intensive and thus very costly.

All of the problems noted above can be reduced in accordance with the present invention.

SUMMARY OF THE INVENTION

The invention meets these and other problems by providing a pluggable or modular terminal architecture in which any terminal product is made up of two classes of equipment; a first class of common equipment and a second class of functional units. The functional units provide for the necessary and/or customer desired functions such as particular input units, particular output units, and a central controller and power for the other functional units whereas the common equipment provides the environment in which the different functional units can operate as desired. The environment includes a communication medium allowing the different functional units to communicate as required, a power distribution apparatus to distribute electrical power among the various functional units and finally a frame for mechanical support. However, the common equipment is so designed that unskilled personnel, without any equipment, can insert a functional unit into the terminal, remove a functional unit from a terminal, and by combining these functions, move a functional unit from one location in a terminal to a different location in the terminal.

Accordingly, in accordance with the present invention, the final assembly step is no longer necessarily performed by the manufacturer. Rather, the final assembly step of installing the various functional units, in the locations desired, may be effected by the customer. As a result, the labor-intensive final assembly step can be eliminated, the requirement for inordinate amounts of stock for different terminal configurations has been reduced, maintenance is simplified since the customer can return only a failed functional unit, and if a spare functional unit of the type that has failed is readily available, the terminal can be quickly returned to full service.

Essential to this capability is the capability of providing the necessary common functions, i.e. mechanical support, power and communications which firstly does not require any fixed wiring, and which can support a collection of functional units in a variety of configurations.

In accordance with the invention, the mechanical support is provided by a frame which has a plurality of openings therein for orienting, retaining and supporting different functional units. The frame is arranged so that a functional unit may be installed in more than one location in the frame. For example, the frame could have one or two locations for a central controller functional unit, allowing the central controller functional unit to be in either of the two locations, or if increased processing was required, a controller functional unit could be located in both locations. Some or all of the functional units may have a footprint which is identical to the footprint of other (or all) functional units. At least in a preferred embodiment of the invention, input/output functional units of a common type are contained within an identical housing. The frame has plural locations within which this housing can be supported, so that any of these functional units of the common type can be supported in any of the specified locations.

In addition to support, each of the functional units (except for the power supply unit) requires regulated power. Part of the common equipment includes a power distribution substrate (or other power distribution facility) on which is supported power carrying conductors which are adapted to mate with power taps on the different functional units. By regularizing the location of the functional unit power tap across the various functional units, a functional unit in any one of a plurality of frame openings, is thus supplied with power by the power distribution substrate. In a preferred form of the invention each functional unit may include a connector, which mates with a corresponding connector fixedly located on the power distribution substrate. Such connector pair can be a card edge connector and a card edge. The regular location of the power tap on the functional unit, and the distribution of the mating apparatus in the substrate means that any of the class of functional units having the regular power tap location, can be located in any of the openings with a mating power supply apparatus.

As an alternative to the power distribution substrate, a plurality of power carrying rails can be provided. The rails are located, relative to the frame, so that functional units supported in the frame are in electrical contact with the rails whereby power can be transferred from the rails to a functional unit requiring power or from a power supply functional unit(s) to the rails.

Finally, each of the functional units (except the power unit) must be interconnected for communication purposes. To this end, the common equipment also includes a data distribution chamber, and each of the functional units (except perhaps the power distribution unit) includes a signal transceiver located to communicate with the data distribution chamber when the unit is installed in any of a variety of locations in the frame. In a preferred embodiment of the invention, the signal transceiver includes an optical transmitter and optical detector, and the data distribution chamber provides a medium whereby optical transmissions from one transceiver can be detected by the transceiver of another functional unit. Each functional unit includes a logic unit, partly to see to the dedicated function of the functional unit and also to effect control of the transceiver.

Accordingly, the invention provides at least in one aspect:

a modular terminal including:
  a. a frame having a plurality of openings therein for orienting and retaining functional units,
  b. one or more functional units supported in said frame and having:
     (1) a signal transceiver for receiving and transmitting data signals,
     (2) a logic unit for processing received signals to cause the included function to be performed,
     (3) a power tap for transferring power to said signal transceiver and said logic unit,
  c. a power distribution means for distributing power among one or more of said functional units and including:
     a pattern of current conductors adapted to be conductively connected to said power taps, and
  d. a data distribution chamber in communication with the signal transceivers of each functional unit for providing a communications medium linking each functional unit with every other functional unit.

As will be described functional units may include:

1. an intrinsic function via a function-specific module (i.e. I/O mechanism, power supply or logic);
2. a housing;
3. supporting circuitry (interface to function-specific module);
4. power tap mechanism; and
5. diagnostic (microprocessor and transducers).

In addition, each functional unit (except perhaps the power supply functional unit) includes a communications transceiver and associated logic module interface.

Thus, in accordance with the invention, inter-functional unit wiring is completely eliminated. The power distributing conductors and power taps provide for power distribution between the power supply unit and the other functional units. The data communication chamber which communicates with signal transceivers on most or all of the functional units provides for data communication. In preferred embodiments of the invention, the signal transceivers operate with optical energy. While there is a wide range of devices capable of supporting the necessary communication, relatively inexpensive infrared devices are presently preferred.

As will be described hereinafter, the data communication chamber is provided with diffusing means for diffusing, throughout the chamber, energy emitted by an optical transmitter in any one of the transceivers. By diffusing the transmitted energy, no constraint is presented concerning the relative location of an operating transmitter-receiver pair. This diffusion effect, along with the elimination of power and communication wiring, enables the functional units to be repositioned within the constraints provided by the mechanical frame and availability of power distribution.

DESCRIPTION OF THE DRAWINGS

In the following portions of this specification, the invention will be further described so as to enable those skilled in the art to make and use the same, when taken in conjunction with the attached drawings in which like reference characters identify identical apparatus and in which:

FIG. 9 is an exploded view of a typical embodiment of the invention illustrating several components thereof;
FIG. 10 is another exploded view, partially broken away to show several of the details;
FIG. 11 is a partial exploded view of still other features;
FIG. 12 is an exploded view of a power supply functional unit in relation to a broken away portion of the frame;
FIG. 13 illustrates the relationship of various functional units to the frame and data distribution chamber;
FIG. 14 is a functional block diagram of a typical functional unit.

DETAILED DESCRIPTION OF PREFERRED EMBODIMENT

FIGS. 1-4 illustrate, respectively, four different printer functional units, each having different features. The internal components of each of the printers illustrated in FIGS. 1-4 is well-known to those skilled in the art and a further detailed description thereof is unnecessary.

Figure 1:
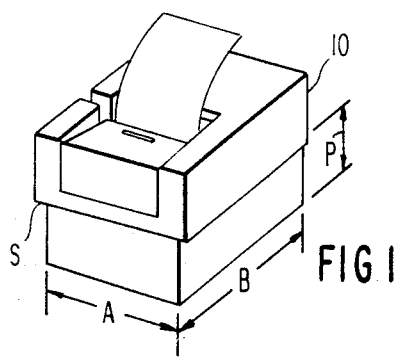
FIGS. 1-4 illustrate four printer functional units.
Figure 2:
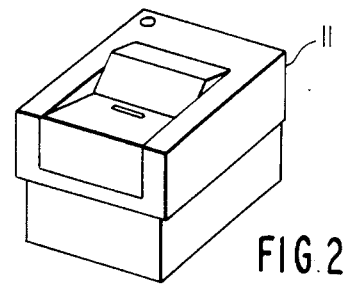
Figure 3:
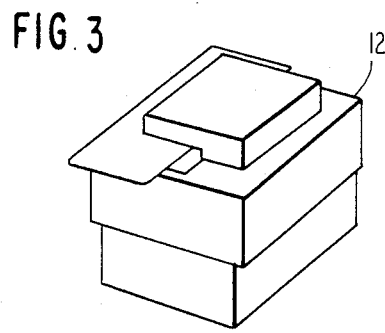
Figure 4:
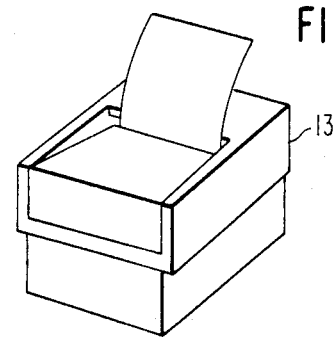

FIG. 1 illustrates a typical customer receipt printer 10; FIG. 2 illustrates a so-called supervisory printer 11, having that designation because the printed output is retained; FIG. 3 provides for a card printer 12 and finally FIG. 4 shows another output printer 13 in which the printer field is wider than that of the customer receipt printer 10. Significantly, each of the printers 10-13 have at least a portion of their shapes which are identical. In the embodiments shown herein, each of the functional units includes a shoulder S, and the printer functional unit outline below the shoulder S is identical; that is the dimensions A and B as well as the depth P (at least below the shoulder S) are identical. With this characteristic then, any frame opening which is compatible with functional unit 10 is also compatible with any of the other printers 11-13. Likewise, since the depth P (below the shoulder S) is identical, functional unit 10, when inserted in a frame opening, interconnects with the substrate (as will be seen) and the same co-action will take place if any of the other functional units 11-13 are substituted for the functional unit 10. This constraint on the similarity of functional unit shape is lessened insofar as the outline of the functional unit above the shoulder S, as will be explained below.

Figure 5:
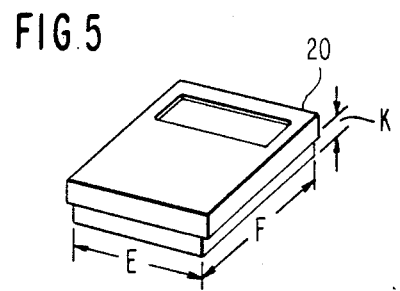
FIGS. 5 and 6 illustrate two display functional units.
Figure 6:
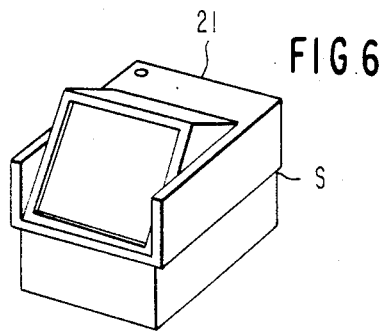

FIGS. 5 and 6 illustrate two different functional units 20-21 each capable of providing a visual display. As in the case of the printer functional units 10-13, the internal components of the displays 20-21 are conventional and need not further be explored. The outlines of the functional units again as in the case of the printers 10-13 is significant. More particularly, each of the functional units again includes a shoulder S (to interact with the frame in a manner to be explained). Insofar as the functional unit extends below the shoulder S, each of the display functional units 20-21 may be identical in outline. However, as shown in FIGS. 5 and 6 the shape of the units 20 and 21 below the shoulder S, is different. The outline of unit 21 is identical to that of the printer units 10-13 while the outline of unit 20 is different; e.g. length E, width F and depth K. As will be described, the parameters E, F, K are identical to the keyboard input units described below.

Figure 7:
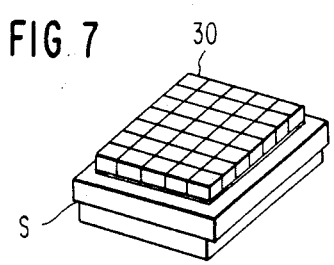
FIG. 7 illustrates a keyboard functional unit.

FIG. 7 illustrates a keyboard functional unit 30 which, in a like fashion to the functional units discussed above, includes a shoulder S. The dimensions of the functional units (E, F and K) below the shoulder S are arranged to interact with the frame dimensions as well as to provide for desired interconnection with the power distribution substrate (in a manner to be explained). While only a single keyboard unit 30 is illustrated, it should be understood that plural different keyboards may have the same shape. They are differentiated, for example, by the keyboard layout (single and double width keys, etc.), number of keys, etc.

Figure 8:
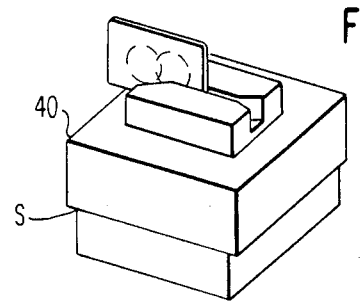
FIG. 8 illustrates a magnetic stripe reader functional unit.

Finally, FIG. 8 illustrates a further functional unit 40 which includes a magnetic stripe reader. This functional unit includes the now-familiar shoulder S and has dimensions A, B, P, below the shoulder S to allow the components included in the functional unit 40 to interconnect with the remaining apparatus in a manner to be described.

FIG. 9 is an exploded view of a typical terminal in accordance with the present invention. In addition to a particular selection of functional units shown in FIG. 9, also illustrated is a frame 70 which includes a plurality of openings therein, each for orienting and retaining a different one of the functional units. Arranged generally below the frame 70 is a power distribution substrate 90. Arranged below the power distribution substrate 90 is a data distribution frame 80 which will form the outlines for the data distribution chamber 85. Finally, located below the data distribution frame 80 is a representation of a cash drawer 95 on which the remaining elements of the terminal shown in FIG. 9 can be supported.

The geometrical arrangement of the various openings (in one embodiment) in the frame are broken down into three different classes. A first class of openings 70C1–70C3 have identical dimensions and are arranged to support any of the keyboard functional units or other functional units with substantially identical dimensions such as display 20.

A second class of openings 70C4–70C6 have common dimensions and are arranged to accept any one of the printer functional units 10–13 or the display functional unit 21 or magnetic stripe reader functional unit 40.

In the embodiment shown in FIG. 9, the remaining openings, 70C7–70C10 are all identical and any one will accept either a power functional unit 60 or a logic functional unit 50. It is not essential to the invention that the openings arranged to support logic and power functional units be identical. On the other hand, the invention also includes the use of frames 70 with a greater or lesser class of openings, down to and including a frame 70 with only a single class of openings, in which event each of the corresponding functional units is of identical shape.

To see, in further detail, the interaction between the various components, reference is now made to FIG. 10 which is an exploded view similar to FIG. 9 except that it is partially broken away and omits several functional units.

As shown in FIG. 10, the frame 70 sits above and is supported by a power substrate 90. The power substrate can be a ceramic/steel, relatively planar substrate including a number of features to be described. These features include first a plurality of openings 92 therein located in a manner to be described. In addition, a plurality of substrate-functional unit power connectors 91 is provided. Interconnected among the substrate-functional unit power connectors 91 is a pattern of conductors 93. When assembled, the power functional units 50 provide electrical energy of appropriate format through the associated substrate-functional unit power connectors 91 to the power distribution pattern of conductors 93. In this fashion, power is supplied to each of the other substrate-functional unit connectors 91 so that, when connected, the associated functional unit, if present, is powered. The power substrate 90 provides one surface for the data distribution chamber 85 which is also partially defined by the data distribution frame 80. The data distribution chamber 85 can also be formed either by the top of the cash drawer functional unit 95 (if present) or the bottom of the terminal, or other functional unit.

Rather than using connectors 91 (such as edge connectors) and card edge contacts for power distribution, the substrate 90 can be eliminated in favor of power carrying rails. The functional units then include power taps to contact the rails for drawing off power from the rails. In this regard, reference is made to FIG. 15 which is described, infra.

As shown in FIG. 10, the frame 70, in addition to the features already described, includes a lower surface 75 having suitable openings (72, 73) to allow the functional unit sitting in a frame opening to communicate with the power distribution system and the data distribution chamber 85. While the lower surface 75 of the frame provides for added rigidity, it can also be eliminated, if desired.

FIG. 10 also shows a plurality of molded fingers 71 arranged to mate with slots 94 on the substrate 90, again to provide for mechanical rigidity. Those skilled in the art will recognize that still other alternatives are available, and if desired the fingers 71 can be eliminated.

Several of the openings in the frame 70, as shown in FIG. 10, include locking apertures 74 arranged to cooperate with corresponding fingers on the functional units to ensure that, when a functional unit is inserted in an opening in the frame it is physically retained. If desired, for example, the locking apertures 74 can be keyed so that only authorized personnel can remove a functional unit from a frame.

If the frame 70 includes symmetric openings which can accept a functional unit in more than one orientation, a non-symmetric keyway can be provided to ensure the unit is inserted in a correct orientation. Such keyway may not be necessary if the unit will be accepted by the frame, and power and data distribution components, regardless of orientation. Another keyway function, that of ensuring that only appropriate units are inserted in selected openings, is implemented by frames having different classes of openings; since a unit for a first class of openings may not fit in openings of other classes.

FIG. 11 shows several of these features of FIG. 10 in still more detail.

As shown in FIG. 11, a typical functional unit 10 includes a locking finger 14 arranged to cooperate with the locking aperture 74 in the frame 70. In addition, the floor 75 of the frame 70 is partially broken away in FIG. 7 to illustrate the substrate-functional unit connector 91 protruding therethrough, and the power distribution conductor pattern 93 on the substrate 90.

FIG. 12 is a similar illustration of a typical power supply functional unit 50. The power supply functional unit 50 includes an outer housing 51 including a locking finger 52 (a corresponding locking finger on the other side of the housing 51 is not illustrated). Interior of the housing 51, the functional unit includes a component card 55 having illustrative components 56, 57 mounted thereon. The card includes an edge connector 55a which is physically arranged so that the functional unit, when inserted in the frame 70 will interconnect with the substrate-functional unit connector 91 of the substrate 90. The functional unit 50 also includes a cold plate 53 including a plurality of heat transfer fingers 54. The cold plate is arranged, within the functional unit 50 in juxtaposition to the component card 55 so that the heat transfer fingers are physically in contact with selected elements 56, 57 on the component card 55, for heat transfer purposes. FIG. 12 also illustrates an LED (or equivalent) indicator 58 protruding through the casing 51. It should be apparent to those skilled in the art that the number of spring fingers 54 in the cold plate 53 and the number of discrete components on the component card 55, as shown in FIG. 12 are merely exemplary, and the number and spacing of components and spring fingers can be increased or decreased, as desired.

FIG. 13 is a cross-section of at least a partially filled terminal illustrating the assembled relationship between several typical functional units, the frame 70, the substrate 90 and the data distribution chamber 85.

As shown in FIG. 13, the frame 70 has installed therein power 50, controller 60, printer 10 and keyboard 30 functional units. Of course, other different functional units may be inserted in still other openings in the frame 70. The substrate 90 as shown is supported below the frame 70 by the data distribution frame 80. In the embodiment, whose cross-section is shown in FIG. 13 the data distribution chamber 85 includes a bottom plate 81 which may or may not be integral with the data distribution frame 80. In the embodiment shown in FIG. 13 the frame 70 does not include a bottom 75.

The power supply functional unit 50 and each of the other functional units includes a card extension 55a with an edge connector which mates with a particular substrate-functional unit connector 91 located on the substrate 90. The housing of a controller unit 60 and power supply unit 50 are partially broken away to show said card edge connector 55a, transceiver 69 and support 68. The various connectors 91 are interconnected via a pattern of conductors 93 supported on the surface of the substrate 90. These conductors may be printed (i.e. deposited) or ribbon conductor fixed to the substrate 90, or equivalents. In this fashion, power supplied by the power functional unit 50 is distributed to each of the other functional units which are connected, and each opening in the frame 70 has an associated connector 91 for the purpose of supplying power to any functional unit inserted therein.

Each of the functional units in a terminal (aside from the power supply functional unit 50) also includes a data transceiver component including a support 68 and an active transceiver 69. The support 68 is arranged to be of such dimensions so that when the associated functional unit is inserted into its opening in the frame 70, the active transceiver 69 is located so as to communicate through an opening 92 in the substrate 90. Of course, in those embodiments wherein frame 70 includes a bottom plate 75, the openings 73 in the bottom plate 75 of the frame register with the openings 92 in the substrate 90. Each of the active transceiver 69 includes a transmitter and receiver.

Preferably the transmitters and receivers operate on optical energy, i.e. the transmitters transmit data in the form of coded optical pulses, and the receivers are responsive to corresponding optical energy. Examples of such infra-red transceivers are described in copending application of Stilwell entitled "Optical Cavity Communication" Ser. No. 362,691, filed on Mar. 29, 1982 and assigned to the assignee of this application. As mentioned above, for practical reasons infrared energy is presently preferred. For purposes of ensuring rapid diffusion, the optical transmitter of the transceiver 69 is preferably an incoherent transmitter such as an LED; in some cases a laser diode could also be used. While the power supply functional unit 50 may also include the transceiver 69, in some circumstances this unit need not include such transceiver 69.

The data distribution chamber 85 is arranged to diffuse optical transmissions throughout the chamber. This is achieved by providing transmitters with a relatively wide field of view, selecting the surface finish and media within the chamber to diffuse the transmitted energy. The media should exhibit little or no absorption at the transmitted wavelength. The surfaces of chamber 85 should not be specular reflectors but rather diffuse reflectors. The depth of the chamber 85 (distance from transmitter to bottom wall) should be large enough to ensure the transmitted energy is diffused. In an embodiment constructed and operated using infra-red transceivers at a depth of ¾" was adequate.

The data distribution chamber has diffusing means which may include a plurality of reflecting surfaces at varying angles with respect to the transceivers to diffuse optical energy impinging on the reflecting surfaces throughout the chamber itself. Such reflecting surfaces can be provided by a paper layer above plastic; the paper is porous to infra-red and serves to diffuse reflections. A bumpy, corrugated or otherwise non-planar surface is adequate. A non-planar surface can be achieved by gluing or securing a material like sand to otherwise planar surfaces. In this fashion, data transmitted by, for example a controller functional unit 60 can be detected at any of the other functional units in the frame. Furthermore, a functional unit inserted in an empty location in the frame 70 is capable of communicating with all other functional units as soon as it receives power from the associated connector 91 since its active transceiver element 69 is appropriately located in communication with the data communication chamber as soon as the functional unit is located in the frame 70.

While an embodiment of the invention which has been constructed operates on a half-duplex channel, i.e. only one transmitter is transmitting at a time, the invention is not necessarily restricted to such an arrangement. If different transceivers were capable of operating at a different wavelengths, then, for each different wavelength another half-duplex channel is provided.

FIG. 14 is a functional block diagram of a typical functional unit. The unit includes a function-specific module 130, e.g. display, printer, etc., a power module 120, e.g. the power tape including edge connector 55a, a logic module 110, e.g. a microprocessor and associated memory, and a transceiver 100 which cooperates with digital input and output of logic module 110. In the case of the controller functional unit 60, the function-specific module 130 may be eliminated or it may comprise a further microprocessor.

Figure 15:
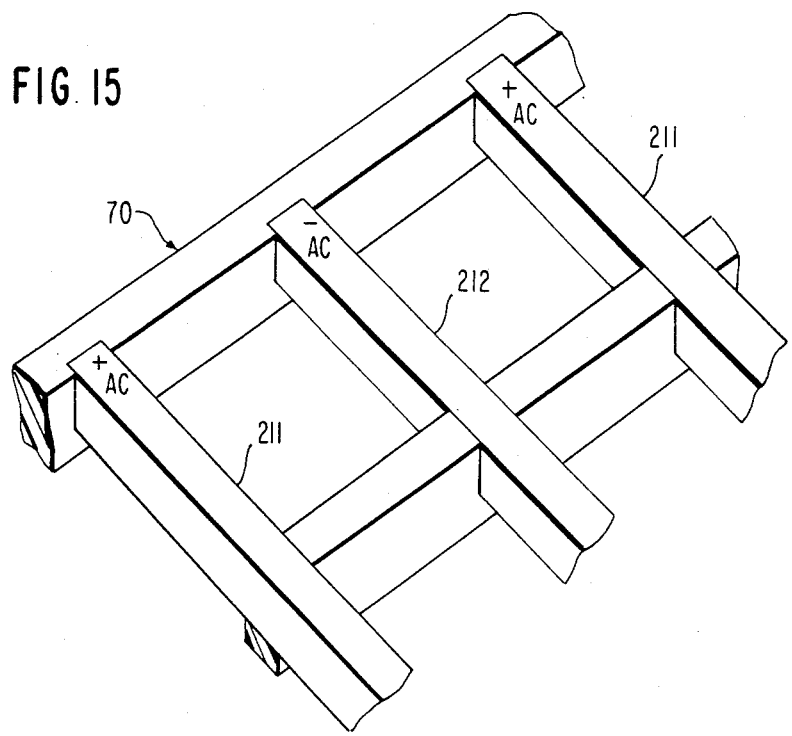
FIG. 15 illustrates power distribution by rails.
Figure 16:
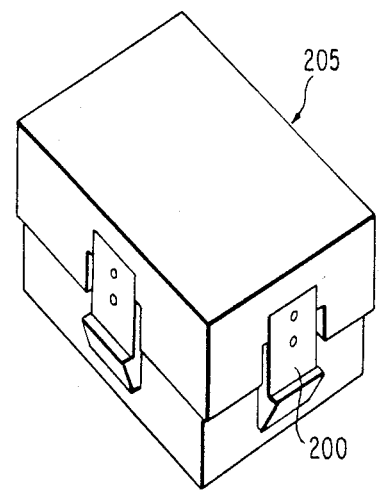

FIG. 15 is an illustration of a portion of the frame 70 which includes power carrying rails 211 and 212 for power distribution to various functional units. The use of such rails eliminates the need for the power distribution substrate 90, the connectors 91 and 55a. For the purpose of transferring power to a functional unit from the rails 211 and 212 or from a power supply functional unit to the rails, the functional units are supplied with insulated metal clips 200 which replace the clips 52. When a functional unit, for example functional unit 205 (in FIG. 16) is inserted into frame 70, the clips 200 contact the rails 211, 212 to allow power transfer. The functional units may have two or four clips, each clip on a different side. With two clips 200, the unit can only be installed in one or two orientations relative to the frame. With four clips 200, the unit can be installed with complete freedom from power distribution constraints.

Figure 17:
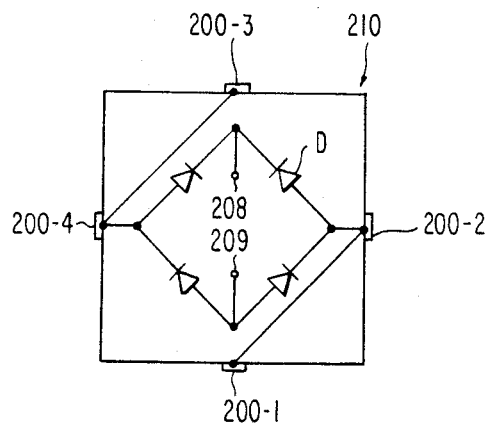
FIGS. 16 and 17 illustrate, respectively, a functional unit to be used where power is distributed by rails and an electrical bridge for interfacing the unit to the rails.

FIG. 17 illustrates a bridge interface circuit 210 comprising diodes D connected between four clips 200-1 through 200-4 allowing AC power distribution on the rails 211, 212 to be converted to DC at the bridge output terminals 208, 209. If the rails carry DC rather than AC, the same bridge circuit can be employed to ensure that proper voltage polarity exists at terminals 208, 209.

Figure 18:
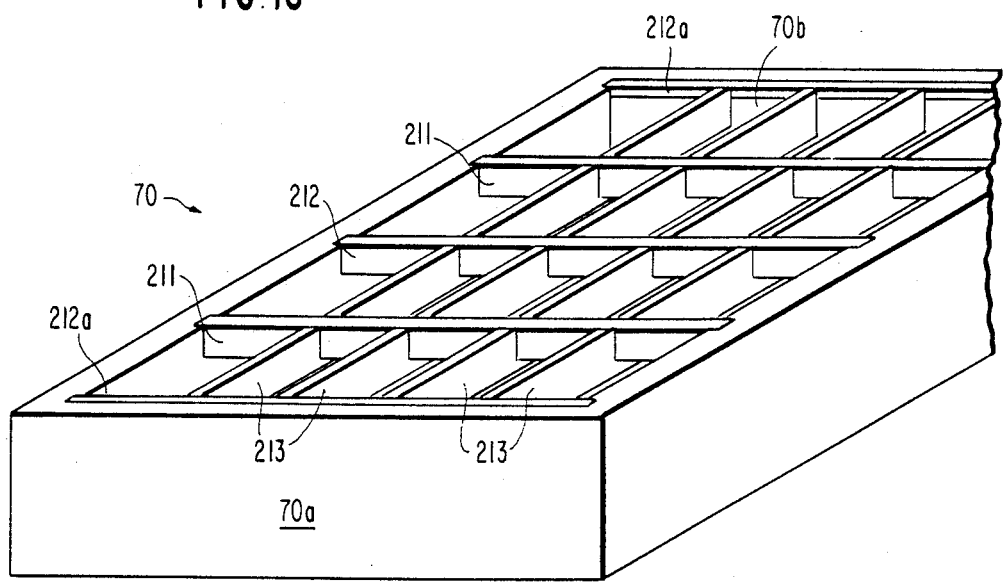
FIGS. 18 and 19 illustrate specific frame embodiments with power distribution rails.

FIG. 18 shows an embodiment wherein the rails 211, 212 include rails 212a, inset into side walls 70a, 70b of the frame 70. Obviously the rails are accessible at the top of the frame when the frame is not filled with functional units. Preferably, the rails therefore carry low voltage power for safety reasons.

Figure 19:
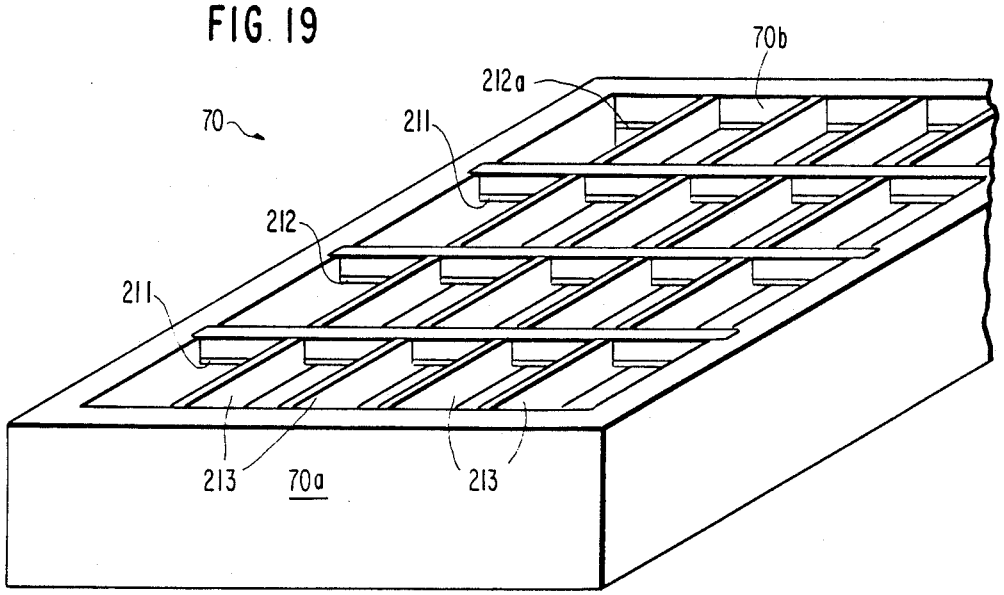

In another embodiment, the rails 211, 212 (of FIG. 15) are recessed below the surface with rails 212a inset into the side walls 70a and 70b as shown in FIG. 19.

Accordingly, in the embodiments illustrated in FIGS. 15-19, the power taps of the functional units comprise a pair of clips 200 and the rails 211, 212 comprise a pattern of conductors.

I claim:

1. An interactive modular terminal including:
    a. a frame having a plurality of openings therein, said openings being operable for orienting and retaining one or more self-contained functional units with some of the units being operable for interfacing with a human operator to provide communication of information between the functional units and the operator,
    b. one or more self-contained functional units, operable to perform an included function, being fitted in the openings and being supported in said frame with each of said self-contained functional units having:
        (1) a signal transceiver for receiving and transmitting data signals,
        (2) a logic unit for processing received signals to cause the included function to be performed,
        (3) a power tap for transferring power to said signal transceiver and said logic unit,
    c. a data distribution chamber in communication with the signal transceivers of each self-contained functional unit for providing a communications medium linking each functional unit with at least one other functional unit, and
    d. a power distribution means for distributing power among one or more of said self-contained functional units and including:
        (1) a pattern of current conductors and adapted to be conductively connected to said power taps,
        (2) one or more openings being positioned in the power distribution means and operable to form a signal communicating path between the data distribution chamber and the signal transceivers.

2. The apparatus of claim 1 wherein: said pattern of current conductors includes plural conductive rails supported by said frame and said power tap includes a contact for electrically contacting at least one of said rails when an associated functional unit is supported in one of a selected plurality of openings in said frame.

3. The apparatus of claim 1 wherein said functional units include one or more of:
    a. an input functional unit including a keyboard,
    b. an output functional unit including a visual display,
    c. an output functional unit including a hard copy printer,
    d. a controller functional unit,
    e. a power supply functional unit.

4. The apparatus of claim 1 wherein at least some of said functional units include a digital microprocessor connected to a transceiver of said functional unit.

5. The apparatus of claim 1 wherein each said transceiver includes:
    an optical energy transmitter, and
    an optical energy detector.

6. The apparatus of claim 5 in which said transceiver transmits and receives infrared or other wavelengths optical energy.

7. The apparatus of any of claims 1-6 in which said data distribution chamber includes diffusing means for diffusing energy from any transceiver throughout the chamber.

8. The apparatus of claim 5 wherein said optical energy transmitter has a relatively wide field of view.

9. The apparatus of claim 2 wherein said rails are supported by said frame below a horizontal plane defined by the uppermost extremities of said frame.

10. The apparatus of claim 2 wherein said rails are supported by said frame in a horizontal plane defined by the uppermost extremities of said frame.

11. The apparatus of claim 1 further including a first set of openings positioned in the frame and operable to enable the power tap on each functional unit to coact with the power distribution means; and
    a second set of openings positioned in the frame and in alignment with the openings in said power distribution means whereby the second set of openings and the openings in said distribution means coact to form a signal communicating path between the data distribution chamber and the signal transceivers.

12. A modular terminal including:
    a. a frame having a plurality of openings therein for orienting and retaining one or more self-contained functional units;
    b. one or more self-contained functional units operable to perform an included function, each of said functional units supported in said frame and having:
        (1) a signal transceiver for receiving and transmitting data signals,
        (2) a logic unit for processing received signals to cause the included function to be performed,
        (3) a power tap for transferring power to said signal transceiver and said logic unit,
    c. a distribution means being placed in spaced relationship with the frame and operable for distributing power and informational signals among one or more of said functional units; and
    d. a data distribution chamber abutting on the frame and in communication with the signal transceivers of each functional unit via openings being provided in the distribution means for providing a communications medium linking each functional unit with at least one other functional unit.

* * * * *